United States Patent [19]

Klimek et al.

[11] 4,250,616
[45] Feb. 17, 1981

[54] METHOD OF PRODUCING MULTILAYER BACKPLANE

[75] Inventors: John J. Klimek, Bloomingdale; Charles L. Tesch, Schaumburg; Ernest M. Feo, Roselle; Ronald W. Lesky, Westchester, all of Ill.

[73] Assignee: Methode Electronics, Inc., Chicago, Ill.

[21] Appl. No.: 23,146

[22] Filed: Mar. 23, 1979

[51] Int. Cl.³ .............................................. H05K 3/36
[52] U.S. Cl. ..................... 29/830; 264/139; 264/263; 264/272; 156/267
[58] Field of Search ................. 29/628, 626, 625, 830; 174/68.5; 264/138, 263, 272; 361/352, 414; 156/257, 267

[56] References Cited

U.S. PATENT DOCUMENTS

| | | | |
|---|---|---|---|
| 3,932,932 | 1/1976 | Goodman | 174/68.5 X |
| 3,977,075 | 8/1976 | Lynch et al. | 29/628 |
| 4,054,939 | 10/1977 | Ammon | 29/625 X |

*Primary Examiner*—Leon Gilden
*Assistant Examiner*—C. J. Arbes
*Attorney, Agent, or Firm*—Charles F. Pigott, Jr.

[57] ABSTRACT

A method of forming an electrical backplane comprising providing an initially oversized ground and potential plate, forming discontinuous slots in a staggered relationship near the edges of the top surface of one of the plates and the bottom surface of the other plates, laminating the plates together by filling the slots with insulative material and trimming the edge portions off by cutting through the filled slots and webs connecting the slots whereby exposed backplane edges lie opposite insulation in the slots of the plates.

10 Claims, 8 Drawing Figures

U.S. Patent  Feb. 17, 1981  Sheet 3 of 3  4,250,616
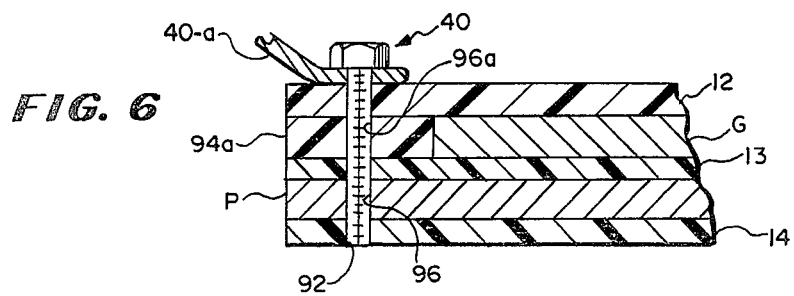
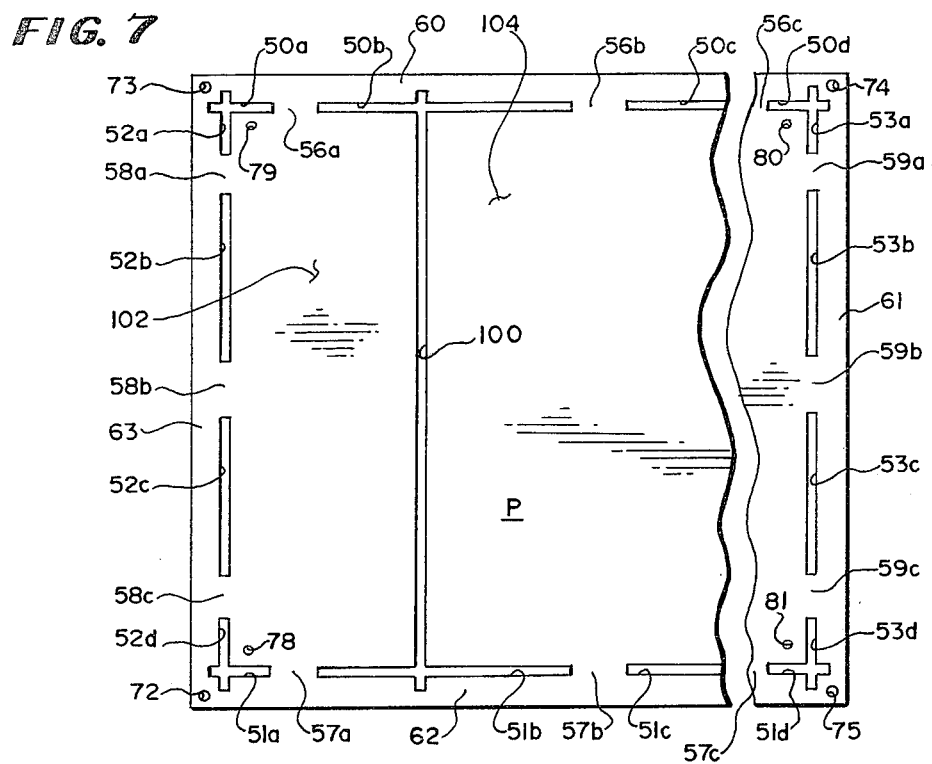
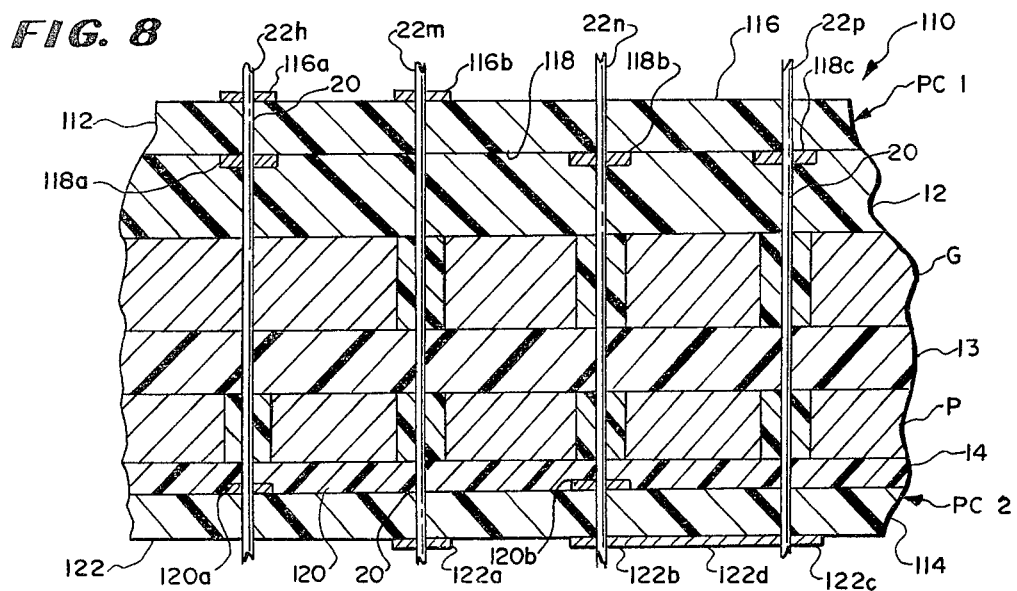

METHOD OF PRODUCING MULTILAYER BACKPLANE

BACKGROUND OF THE INVENTION

This invention concerns a novel electrical backplane or "mother board" and a method for making the same.

In telecommunications, biomedical instrumentations, computer systems, and in the data processing industry itself, it is common to use innerconnecting backplane assemblies also known as "mother boards," each having connectors mounted thereon into which printed circuit boards can be inserted. Each printed circuit board is disposed generally perpendicular to the backplane, and further can be merely slipped into or out of its specific connector.

Typically, spring type contacts provided in the connector mounted on the backplane establish electrical continuity at separate terminal areas on the printed circuit board. The printed circuit board can have a printed circuit on one or on both faces, so that the connector would thus have one set or two opposing sets of spring contacts that engage the terminal areas on the respective face of the printed circuit board.

A backplane assembly generally has many receiving contacts, arranged in a grid network, and a number of connectors are generally fitted over and connected to separate groups of these contacts, so that several printed circuit boards may be connected to the backplane and into the circuitry of the device. However, where many printed circuits are transmitted through the backplane, the current carrying capacity of the backplane is quickly reached, so that more than one and frequently many backplanes must be used. This adds costs to the device because of the separate different backplanes needed and the resulting interconnection components needed between the backplanes themselves.

The problem of low current carrying backplanes is readily understood however, since many prior backplane ground and potential planes have been made by coating a layer of copper on a board in the form of a printed circuit, and this coating is very thin. This limits the current carrying capacity generally only to a few amps.

SUMMARY OF THE INVENTION

This invention concerns an improved stacked interconnecting backplane and/or printed circuit board construction fabricated of solid metal potential and ground plates separated from one another by and sandwiched between insulating dielectric laminate sheets. The invention also concerns an improved method of making such a unitary backplane or circuit board construction. In the illustrative embodiment, prior to the lamination step, each plate is oversized having peripheral rim areas around the finished dimensions of the backplane, and these oversized plates are slotted peripherally along the approximate finished dimensions of the backplane with staggered aligned saw cuts which thereby tie the oversized rim areas to the body portion with tie bars between the saw cuts. The saw cuts are staggered so that when the planes are stacked on one another, the slots of one plane overlap and extend beyond the tie bars on the opposite plane. Also, oversized clearance holes are drilled through certain of the potential and ground planes, where no electric continuity is desired between an inserted contact and the potential and/or ground plate.

The circuit boards, insulation sheets if used, and the potential and ground plates are laminated together in the desired stacked arrangement, and all slots and oversize clearance holes are filled solid with the insulative material. The network of openings for receipt of the individual contacts are then drilled, and those openings through the predrilled but now filled clearance holes are spaced from that specific plate to keep the inserted contact electrically insulated from the plate. The peripheral rim areas are then machined off medially along the aligned slots, but since the insulation-filled slots of one plate overlie the tie bars of the other plate, no metal edges of one plate are adjacent metal edges of the other plate. In this manner, arcing across the plates because of machining burrs or the like is eliminated.

Registry securing means are provided in the rim and body areas of the planes to establish and maintain proper registry of the plates during the stacking assembly of the components, during the slotting, both drilling, and laminating operations, and during the final edge machining operations.

It is preferred to oversize all four edges of the ground and potential plate and cut off the excess rim areas, since by selective location of the tie bars and by additional cross slots on the potential plate, it is possible to define many electrically insulated potential plates in the unitary backplane. Also, printed circuit boards can be laminated adjacent the outer face or faces of the backplane to provide with circuit paths on the printed circuit boards for the interconnection of the various contacts in the unitary backplane. Field connections are made to the potential and ground planes at selective taps or terminals provided around the backplane.

BRIEF DESCRIPTION OF THE DRAWINGS

FIG. 6 is a sectional view, as seen generally from lines 6—6 in FIG. 1, illustrating specific details of construction of the subject backplane and the connection terminal for an exterior lead;

FIG. 7 is a plan view of the potential plane or plate used in the backplane disclosed herein, illustrating specific details of the crosscut slotting; and FIG. 8 is a sectional view similar to FIG. 2, except showing an alternate embodiment of this invention, including a pair of double sided printed circuit boards sandwiched on and laminated to the backplane illustrated in the previous embodiment of FIGS. 1 and 2.

DETAILED DESCRIPTION OF THE INVENTION

Figure 1:
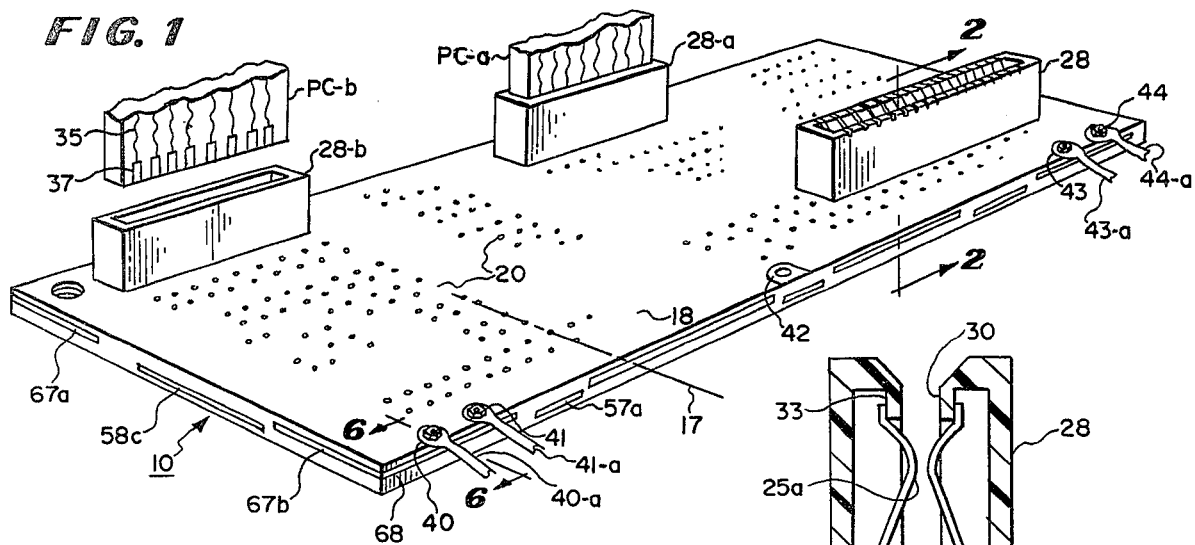
FIG. 1 is a perspective view of a backplane assembly formed according to the subject invention, illustrating three separate connectors thereon and two separate printed circuit boards assembled and preassembled respectively, relative to two of such connectors.

FIG. 1 illustrates a backplane assembly 10 which includes a ground plane or plate G (see FIG. 2), a potential plane or plate P, and separating and sandwiching insulator sheets or plates 13, 12, and 14, respectively, all laminated together. The backplane 10 has a network or grid-like arrangement of openings 20, arranged generally as a plurality of parallel rows 17 and parallel columns 18. The openings 20 extend completely through the backplane 10 and typically are round, the same being drilled by tape-controlled automatic drilling equipment or the like. In practice, the openings are quite closely spaced to one another, having as little as an eighth of an inch spacing between them, so that a backplane 10 measuring only approximately fifteen by twenty inches can have well in excess of fifteen thousand separate openings 20.

A conductive terminal or contact 22 (FIG. 2) is inserted into each of the openings 20 and is adapted to establish electric continuity with any one or possibly several of the components of the backplane as will be more fully outlined. In the preferred embodiment, the contact has a square or rectangular cross section at pin 23 slightly larger than the dimension of the opening 20 so that a certain press fit is required in order to insert the contact pin completely into the opening 20. This mechanically retains the contact pin in place within the backplane and further, as will be noted in greater detail later, establishes a sound electrical connection with the particular backplane component. The contact 22 further projects at end terminal 24 beyond the face of the backplane, and this terminal 24 is used in any of several known manners to form an exterior connection with a wire or header connector or the like (not shown) to establish an electrical connection with an exterior component device or with another contact terminal.

Figure 2:
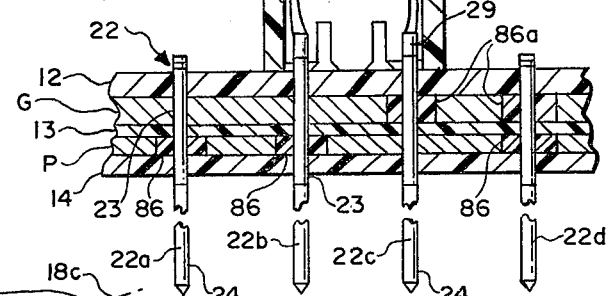
FIG. 2 is a sectional view, as seen generally from line 2—2 in FIG. 1, illustrating specific details of construction of the subject backplane and connector.

The end 25 of the contact 22 opposite the terminal 24 is flared out in any of several known shapes so as to form a contact face 25a (see FIG. 2). A tubular-like insulator or connector 28 fits over the projected contact ends 25 of a number of adjacent contacts 22 and is adapted to present inward disposed edges which snap over lateral shoulders 29 formed on the end contacts so that the insulator or connector 28 is frictionally held snugly against the face of the backplane. The connector 28 has an elongated slot 30 which is suited to receive a printed circuit board. Two such printed circuit boards PC-a and PC-b are illustrated in FIG. 1 where PC-b is shown in a preassembled but removed relationship relative to its connector 28-b, and printed circuit board PC-a is illustrated in assembled relationship within the connector 28-a. There is no printed circuit board illustrated with the connector 28 although one is intended to be used therewith.

The contact ends 25 shown in FIG. 2 are biased by their resiliency toward one another and are restrained by abutment of the contact engaging the connector lip 33 adjacent the slot 30. The camming type angling of the contact faces 25a allows the contact faces 25a to be moved apart as the printed circuit board is pushed into the connector slot. It is possible to have the circuit boards provided with conductive paths on either or both sides of the board, and at least some of the circuit paths 35 are illustrated on board PC-b and terminate along end terminals 37. When the circuit board is positioned within the connector, the printed circuit board terminals 37 make electrical contact with the separate faces 25a of the adjacent contacts 22, thereby rendering the potential on the contact the same as that on the respective circuit board terminal 37. The backplane assembly further has terminals or taps 40, 41, 42, 43, and 44 (see FIG. 1) for bringing a ground and potential to the respective plate of the backplane, and leads 40-a, 41-a, and 44-a are shown connected to the correspondingly numbered taps. As will be more fully explained later, it is possible to have different potential planes and thus different potentials on these planes, which explains why three wire leads have been illustrated in FIG. 1 connected to the ground and potential plates.

In the subject backplane assembly 10, the ground and potential plates G and P are each of a finite metal plate and are not of the coated copper type generally characteristic of printed circuitry. For example the plates preferably would be of copper, typically between 0.010" and 0.125" thick (0.25 and 3.2 mm), although thicker plates can be used but are generally not needed. Also, either plate can be of a ferrous or iron alloy, should there be a need for a conductive but yet magnetic shield plate. The heavy ground and potential plates provide great current carrying capacity, measured in hundreds of amps, and any voltage drop or differential along either the ground or potential plane is virtually eliminated.

It is preferred to form the insulator sheets 12, 13 and 14 by the lamination onto and between the ground and potential planes, which provides rigidity to the backplane and also precludes any moisture or dirt from locating between such interfaces. The operation and consistency of such a laminated construction is superior to merely stacked and staked backplanes, since any shifting or variation in the spacing between the stacked components allows for changes in the capacitance of the boards. It might however be desirable to use separate insulator boards (not shown) and to laminate these boards onto and between the faces of the ground and potential plates.

The backplane can be used in any of innumerable operations of control and/or interconnection of circuits and typically is mounted in an appropriate frame (not shown) where the opposite sides of the board are accessible. This allows placement of the circuit boards into the connectors and exterior connections to the exposed terminals via header connectors or the like. In practice, the backplane may be disposed vertically to allow for convective air flow over and past the components for cooling, and it may be preferred to have the printed circuit boards also disposed vertically. However, the disposition of the backplane does not form any part of this invention, which as will be noted is directed to the specific construction of the backplane and to the method of forming the backplane.

Figure 3:
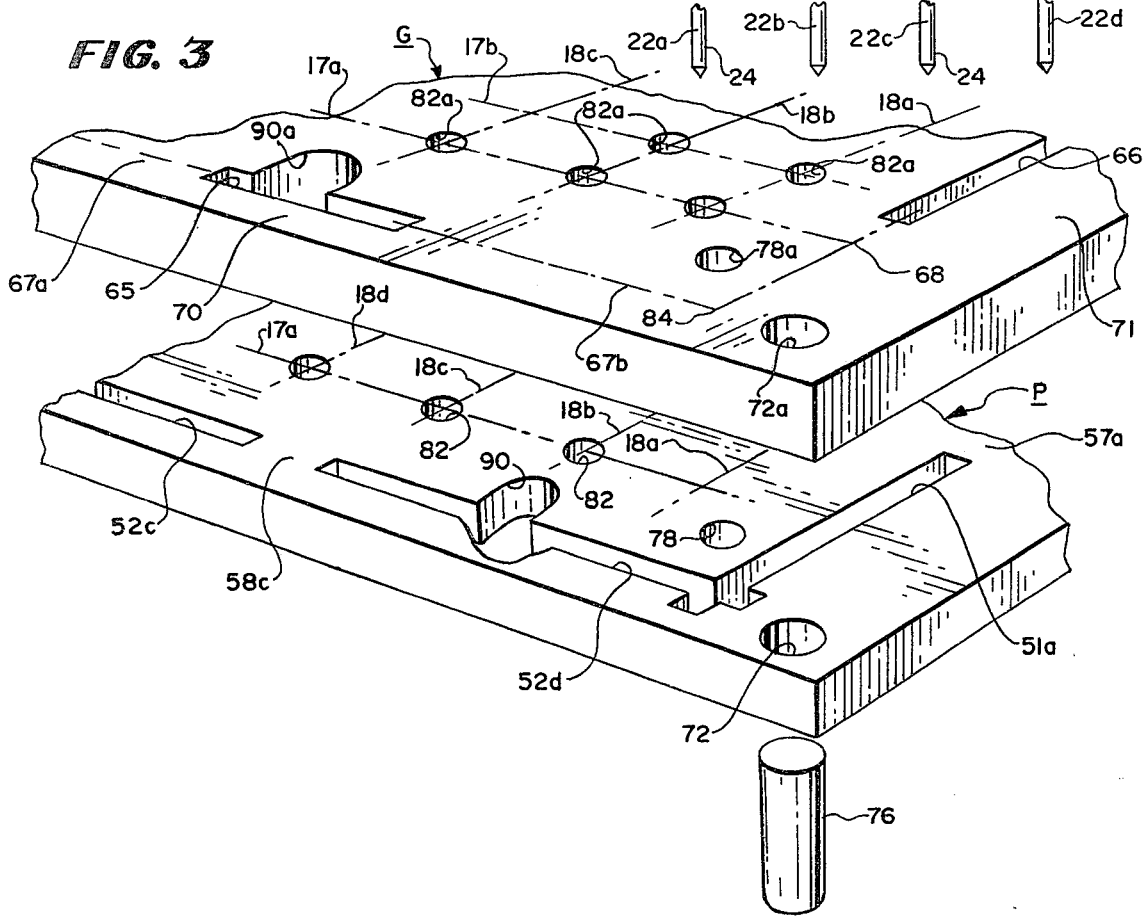
FIG. 3 is a perspective view of the major components used to form the backplane illustrated in FIGS. 1 and 2, shown in a prefabricated but generally stacked relationship, where parts of the components are broken away for clarity of disclosure.
Figure 4:
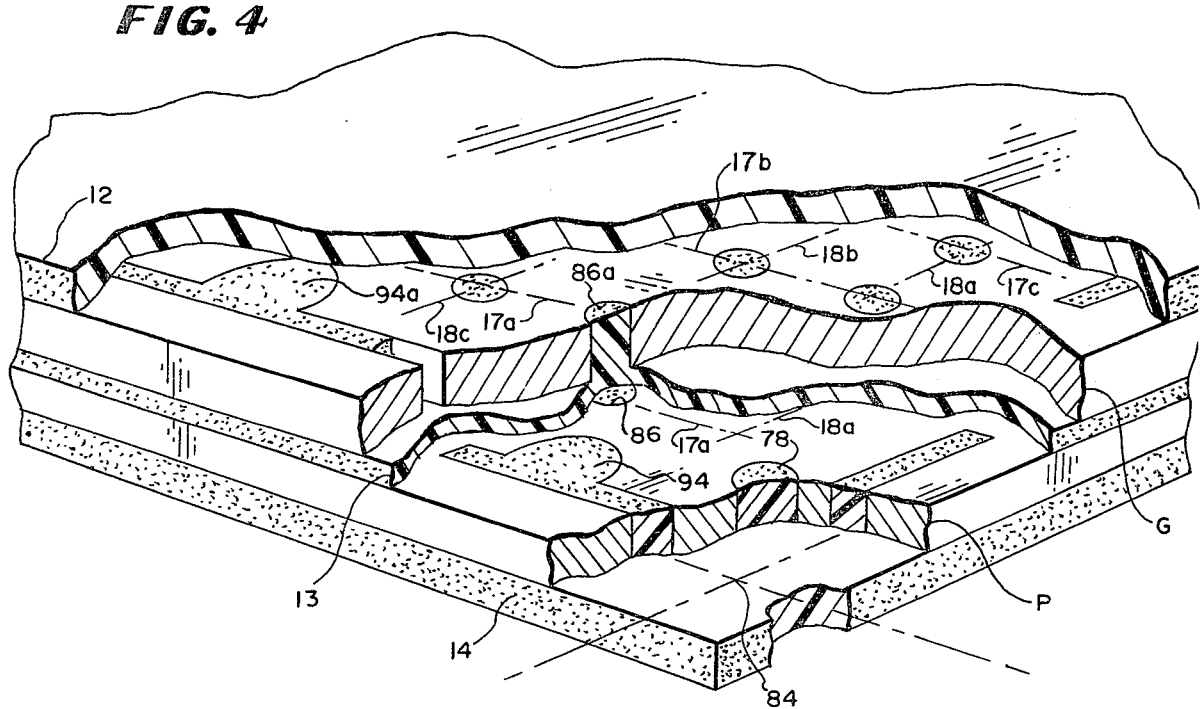
FIG. 4 is a perspective view of the major components used to form the backplane illustrated in FIGS. 1 and 2, shown in a laminated but prefinished disposition, where parts of the components are broken away for clarity of disclosure.
Figure 5:
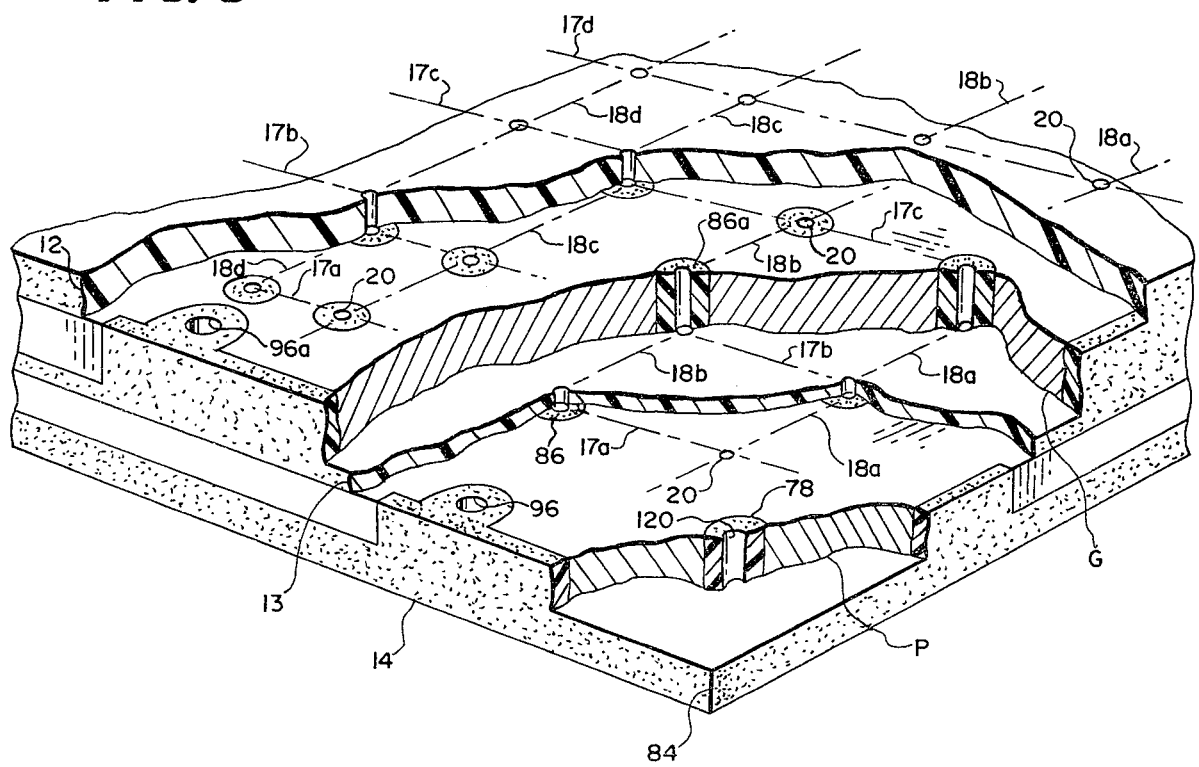
FIG. 5 is a perspective view similar to FIG. 4, except showing the backplane in the finished condition, where again parts of the components are broken away for clarity of disclosure.

Referring now to FIGS. 3, 4 and 5, the ground plate G, potential plate P, and insulator plates 12, 13 and 14 are illustrated in various stages of fabrication. In FIG. 3 the ground and potential plates are illustrated separated laterally from one another as if in a stacked relationship but prior to the lamination step. FIG. 7 shows in a smaller scale a plan view of the potential plate P, and this plate has aligned peripheral slots 50, 51, 52 and 53. Specifically there are aligned slots 50a, 50b, 50c and 50d adjacent one plate edge, aligned slots 51a, 51b, 51c and 51*d* extending parallel to these slots 50 but adjacent the opposite plate edge, and aligned slots 52*a*, 52*b*, 52*c* and 52*d* and the counterpart aligned parallel slots 53*a*, 53*b*, 53*c* and 53*d* adjacent third and fourth plate edges and extending normal to slots 50 and 51. The slots 50, 51, 52 and 53 are typically formed as cross cuts made by circular saw or the like completely through the plate and in a skipping manner to leave webs or tie bars between the slots. Thus, tie bars 56*a*, 56*b* are 56*c* are between the slots 50*a*, 50*b*, 50*c* and 50*d* respectively; tie bars 57*a*, 57*b* and 57*c* are between the slots 51*a*, 51*b*, 51*c* and 51*d* respectively; tie bars 58*a*, 58*b* and 58*c* are between slots 52*a*, 52*b*, 52*c* and 52*d* respectively; and tie bars 59*a*, 59*b* and 59*c* are between the slots 53*a*, 53*b*, 53*c* and 53*d* respectively. The illustrated slots are generally aligned with one another and as noted extend in a peripheral fashion to define exterior rim areas 60, 61, 62 and 63 outwardly adjacent the slots 50, 51, 52 and 53 respectively. The tie bars 56, 57, 58 and 59 connect the rim areas 60, 61, 62 and 63 to the body portion of the potential plate P formed inwardly of the peripheral slots 50, 51, 52 and 53.

The ground plate G is likewise provided with similar peripheral slots, only slots 65 and 66 being illustrated in FIG. 3 for example, and these ground plate slots are staggered relative to the potential plate slots. Thus, as illustrated in FIG. 3, the ground plate slot 65 is shown opposite the potential plate tie bar 58*c* and extends beyond the ends of the tie bar to overlie with the adjacent potential plate slots 52*c* and 52*d*. Likewise, the slot 66 is shown opposite the tie bar 57*a* and extends beyond the ends of the tie bar to overlie the slots 51*a* and 51*b* (FIG. 7). Also, the potential plate slot 52*c* is opposite and extends beyond the ground plate tie bar 67*a* to overlie illustrated ground plate slot 65 and the nonillustrated next aligned slot. The potential plate slots 52*d* and 51*a* overlie the ground plate tie bars 67*b* and 68, respectively. Oversized ground plate rim areas are located outwardly of the respective slots, only rim areas 70 and 71 being illustrated adjacent the slots 65 and 66 respectively. Located in the potential plate areas 60, 61, 62, and 63 are four corner guide openings 72, 73, 74 and 75 (FIG. 7). Similar guide openings are provided in the ground plate rim areas in exact registry with these potential plate openings, although only opening 72*a* is illustrated in registry with opening 72. Pin means fit through the aligned guide openings in the ground and potential plates to establish proper registry of the plates, although once again only pin 76 is illustrated and is intended to fit through openings 72 and 72*a*. Additionally, there are guide openings 78, 79, 80 and 81 located through the body portion of the potential plate, and the corresponding registry openings (only 78*a* being shown) in the ground plate, which are used for holding the plates in registry during certain fabrication steps of the unitary backplane assembly.

As noted above the backplane has the many openings 20 arranged in the grid or network as rows 17 and columns 18, where each opening is designed to receive one contact 22. In the design of the backplane, certain of the contacts would have electrical continuity with the ground plate G, certain others of the contacts would have electrical continuity with the potential plate P, and still further of the contacts would be electrically insulated from both the ground plate or the potential plate. Note that since each contact is press fitted into its opening 20, if that opening were drilled directly into the backplane 10 the inserted contact would make electrical contact with the plate. However, for the contact that is to be electrically isolated from the potential plate and/or the ground plate, such plate or plates at the location of that contact are predrilled with a clearance hole 82 or 82*a* (see FIG. 3) of significantly larger diameter than the contact. The predrilling step is performed on the plate before the plates are laminated together to form the unitary assembly, but is performed preferably on the same automatic tape controlled machine that is used to drill the openings 20. Consequently the opening 82 is on the exact centered registry as the opening 20 would be. These holes are illustrated in FIG. 3 at the various locations of the grid network. For convenience of common reference, the rows and columns are numbered 17*a*, 17*b*, 17*c*, etc. and 18*a*, 18*b*, 18*c*, etc. moving in from the corner 84 of the finished groundplane.

Each hole 82 is filled completely during the lamination step with a plug or core 86 or 86*a* (FIG. 4) of a fiberglass resin laminate, or epoxy such as of an FR4 classification, which is an insulating material. Thus, when the backplane openings 20 are subsequently drilled according to the grid network, certain of these openings are drilled through the fiberglass insulating core or plug 86 or 86*a* which separates and insulates the contact pin from the particular potential or ground plate respectively. The possibility further of having burrs or other metallic splinters lapping from the plate having the opening 20 drilled therein across the insulation sheet 13 to the other plate is virtually eliminated. The particular gridwork of predrilled clearance holes 82 is preconceived and arranged depending upon the electrical continuity characterisics of the contacts in the backplane assembly.

Cutouts 90 and 90*a* (FIG. 3) further are illustrated and used in the same manner as the clearance holes 82, except to isolate the potential or ground connection terminal 92 (FIG. 6) of the field taps 40, 41, 42, 43 and 44 (FIG. 1), from the other plate. In this regard, each cutout 90 and 90*a* is located in the potential or ground plate P and G respectively, and is directly opposite a noncutout portion of the opposite ground or potential plate. Consequently when the plates are laminated, the insulating fiberglass resin fills the cutout 90 with a core or plug 94 and 94*a* (FIG. 4) through which a smaller hole 96 and 96*a* respectively, can be drilled for receipt of the tap terminal 92. A self tapping bolt can be used and threaded into the drilled hole 96 or 96*a* and will make electrical continuity with this plate, while the insulating laminate core 94 in the cutout 90 separates the bolt terminal 92 from the other plate. The terminal 40-a illustrated in FIG. 6 is shown connected in electrical continuity with the potential plate P and electrically isolated from the ground plate G. If desired, the cutout 92 might in part be blocked or masked so that the lamination step does not completely build up the insulate laminate adjacent the potential plate so that the terminal bolt 92 can be fitted through the hole and held in place trapped between the bolt head and a nut drawn down on the bolt directly against the face of the plate. However, some laminate cover should yet cover the edge of the other plate to keep it from possible direct contact with the positioned terminal 92.

Also of interest in FIG. 7 is the cross cut or slot 100 extending between the slots 50 and 51, in a direction generally parallel to the slots 52 and 53. This slot 100 extends completely across the body portion of the plates into the respective rim across 60 and 61 and through the opposing slots 50 and 51. Consequently, after the potential and ground plates have been stacked and laminated and the land areas 60, 61, 62 and 63 cut off along the slots 50, 51, 52 and 53, the interior land areas 102 and 104 of the potential plate are completely separated from one another and further are electrically insulated from one another by means of fiberglass filling the slot 100. Consequently, by providing exterior taps as illustrated at 40 and 44 for example to the separate potential planes 102 and 104, a multiple potential backplane assembly is thus readily fabricated. Tap 41 is intended to be in electrical continuity with the ground plate G. The illustration only shows two such separate potential plate sections 102 and 104, although this number can be increased if desired.

Referring to FIG. 2, the four specific contacts 22a, 22b, 22c and 22d are illustrated and the following brief summary will be given for clarification of the invention. The contact 22a has electrical continuity with the ground plate G and is maintained isolated from the potential plate P because of the fiberglass laminate plug 86 filling the clearance opening 82. The contact 22b is like contact 22a except is shown also as having the exposed contact face 25a. The contact 22c is electrically isolated from the ground plate G while it is in electrical continuity with the potential plate P. The contact 22d is electrically isolated from both the ground and the potential plates, and thus it is at a potential different from or at least independent of either of these plates.

It is thus to be understood that during the lamination assembly of the potential and ground plates in forming the backplane assembly, the slots 50, 51, 52 and 53, the openings 78–82 and the cutouts 90 in both the ground and potential plates are filled with the insulating laminate. The lamination further unitarily bonds the ground and potential plates together and sandwiches the plates to define an encapsulated block. This eliminates the possibility of moisture or dirt or any other contaminants from entering between the plates and further maintains the plates rigid relative to one another. This stabilizes the consistency of operation of the backplane. Even after the openings 20 have been drilled according to the desired grid network, the possibility of having contaminating moisture or dirt or the like going to between the plates via the opening 20 is eliminated with the proper laminate. The press fit insertion of the contact 22 into the opening 20 establishes good electrical continuity between the inserted contact and the respective potential or ground plate.

FIG. 8 shows a second embodiment of a ground plane 110 with the addition of a pair of double sided printed circuit boards disposed in outward sandwiching relationship to the backplane assembly 10 similar to that illustrated in the previous embodiments of FIGS. 1–7, so that like components are identified by the same means in FIG. 8. In this embodiment there is illustrated a first printed circuit board PC-1 and a second printed circuit board PC-2 which have respective substrate boards 112 and 114 and further which have formed thereon in a typical appropriate manner a plurality of conductive paths. Thus, the conductive paths are illustrated as 116a and 116b on the outer face 116 of the printed circuit board substrate 112; as paths 118a, 118b and 118c on the inner face 118 of printed circuit substrate 112; as paths 120a and 120b on the inner face 120 of the printed circuit board substrate 114; and as paths 122a, 122b and 122c on the exterior face 122 of the printed circuit board PC-2. The contact paths 116a and 118a are illustrated as being at the same potential, being connected directly by inserted contact 22h. It would be possible to have a pass through terminal extended annularly of the drilled opening 20 to increase the reliable contact made between the inserted contact 22 and the conductive path. It is noted further that these paths extend normal to the plane of viewing, except for paths or contacts 122b and 122c, which are interconnected by path 122d.

For further clarification of the embodiment in FIG. 8, contact 22h as illustrated is in electrical continuity with the printed circuit board paths 116a, 118a and 120a, and with the ground plate G. The contact pin 22m likewise is in electrical continuity with the printed circuit board contact paths 116b and 122a, and is electrically isolated from both the ground plate G and the potential plate P. The contact 22n is in electrical continuity with the printed circuit contact paths 118b, 120b and 122b, and likewise is isolated from both the ground and potential plates. The contact 22p is electrically isolated from both the potential and ground plates, and is in electrical continuity with the printed circuit board contact paths 118c and 122c. However, because of the conductive circuit board path 122d, the contacts 22n and 22p are at the same potential.

The particular arrangements disclosed are merely illustrative of the concept disclosed although many variations can be readily made. The important factor is that high current can be carried on the subject backplane assembly having the metal conductive ground and potential plates, and that printed circuit boards can be laminated to the exterior surfaces of the backplane and connected readily by means of the contacts 22 inserted through drilled openings 20. The laminated construction of the backplane assembly further enhances the reliability in maintaining plate and/or circuit board rigidity and in precluding the migration of dirt, moisture and other contaminants between the plates.

The insulative filled clearance holes further preclude the possible shorting out because of burrs or the like transferring from one potential plane through the insulating barrier to the other potential plane during the drilling of the openings 20. Moreover, the manner of forming the exterior dimensions of the backplane assembly initially by using oversize plates and of slotting the plates in the staggered fashion to have the tie bars of one plate always aligned opposite the slots on the other plate and vice versa is reliable and economical. Further, in cutting off the excess rim areas medially through the slots, the finished edge character of the backplane provides for exposed epoxy filled cutouts and slots and the cut tie bars, as can be seen in FIGS. 1 and 5 along the two exposed edges on the backplane assembly 10.

Since the metal that is to be fabricated is located opposite a laminate filled slot, hole or cutout on the other plate, the likelihood of having electrical shorting or arcing via machining burrs resulting from the cutting or drilling fabricating steps is virtually eliminated. This saw cut approach to the separation of the oversized rim areas from the body portion of the assembly maintains the exterior dimension of the backplane exact with squared and smooth edges. Also, it is possible to drill small locating holes 130 through the insulating cores or plugs in the guide holes 78 without contacting either the ground or potential plates.

We claim:

1. A method of producing a multilayer backplane assembly of the type including a conductive metal potential plate, a conductive metal ground plate, and insulative plates between and outside of the potential and ground plates, said method comprising the steps of forming oversize potential and ground plates, forming slots along the edge portions of each of the potential and ground plates which slots separate a main body of each potential and ground plate from oversize marginal edge portions, said slots being formed in segments interrupted by webs which connect the marginal edge portions to the main body portion of each of said potential and ground plates, laminating said potential, ground and insulative plates together and filling said slots with insulative material, and trimming off said marginal edge portions by cutting through said filled slots and severing said webs.

2. A method as defined in claim 1 where the slots formed in said ground plate are staggered relative to the slots formed in said potential plate whereby in the laminated assembly each slot in one of said potential and ground plates is opposite a web in the other plate.

3. A method as defined in claim 1 where each side of said ground and potential plates is formed with a plurality of said slots, each slot being separated from an adjacent slot by one of said webs.

4. A method as defined in claim 3 where each side of said ground and potential plates is formed with a plurality of said slots and a plurality of said webs which separate adjacent slots from one another.

5. A method as defined in claim 1 where each of said ground and potential plates is formed as an oversize generally rectangular plate, said slots being formed approximately parallel to each of the four edge portions of said plates, the slots in two opposite sides of each plate being approximately parallel to one another, and the slots in the other two opposite sides being approximately parallel to each other, and where each of four marginal edge portions is trimmed off by cutting through said filled slots and severing said webs.

6. A method as defined in claim 1 where a plurality of guide holes are formed in said marginal edge portions to facilitate assembly of said plates prior to trimming off said marginal edge portions.

7. A method as defined in claim 2 where the slots in one of said potential and ground plates are each of a length exceeding the length of the corresponding web in the other plate.

8. A method of producing a multilayer backplane assembly of the type including a conductive metal potential plate, a conductive metal ground plate, and insulative plates between and outside of the potential and ground plates, said method comprising the steps of forming oversize potential and ground plates, forming slots along the edge portions of each of the potential and ground plates which slots separate a main body of each potential and ground plate from the oversize marginal edge portions, said slots being formed in segments interrupted by webs which connect the marginal edge portions to the main body portion of each of said potential and ground plates, each side of said potential and ground plates being formed with a plurality of said slots, each slot being separated from an adjacent slot by one of said webs, and the slots formed in said ground plate being staggered relative to the slots formed in said potential plate whereby in the laminated assembly each slot in one of said potential and ground plates is opposite a web in the other plate, laminating said potential, ground and insulative plates together and filling said slots with insulative material, and trimming off said marginal edge portions by cutting through said filled slots and severing said webs.

9. A method as defined in claim 8 where each of said ground and potential plates is formed as an oversize generally rectangular plate, said slots being formed approximately parallel to each of the four edge portions of said plates, the slots in two opposite sides of each plate being approximately parallel to one another, and the slots in the other two opposite sides being approximately parallel to each other, the slots in one of said potential and ground plates each being formed of a length exceeding the length of the corresponding web in the other plate, and each of the four marginal edge portions being trimmed off by cutting through said filled slots and severing said webs.

10. A method as defined in claim 9 where a plurality of guide holes are formed in said marginal edge portions to facilitate assembly of said plates prior to trimming off said marginal edge portions.

* * * * *